(12) United States Patent
White

(10) Patent No.: US 6,181,217 B1
(45) Date of Patent: Jan. 30, 2001

(54) VCXO WITH REDUCED PWM EFFECTS HIGH SLEW RATE CONDITIONS

(75) Inventor: David Glenn White, Indianapolis, IN (US)

(73) Assignee: Thomson Licensing S.A., Boulogne (FR)

( * ) Notice: Under 35 U.S.C. 154(b), the term of this patent shall be extended for 0 days.

(21) Appl. No.: 09/353,221

(22) Filed: Jul. 14, 1999

(51) Int. Cl.[7] .................................................. H03B 5/32
(52) U.S. Cl. ..................................... 331/158; 331/116 FE
(58) Field of Search .................. 331/116 R, 116 FE, 331/158, 177 V

(56) References Cited

U.S. PATENT DOCUMENTS

| | | | |
|---|---|---|---|
| 5,113,156 | * | 5/1992 | Mahabadi et al. ..................... 331/109 |
| 5,844,448 | * | 12/1998 | Jackoski et al. ....................... 331/158 |
| 6,025,757 | * | 2/2000 | Tsukagoshi et al. .................. 331/158 |
| 6,046,648 | * | 12/1998 | Nakamiya et al. ............. 331/116 FE |

FOREIGN PATENT DOCUMENTS 58-111505  *  7/1983  (JP) ...................................... 331/158

\* cited by examiner

*Primary Examiner*—Robert Pascal
*Assistant Examiner*—Henry Choe
(74) *Attorney, Agent, or Firm*—Joseph S. Tripoli; Frederick A. Wein

(57) ABSTRACT

A VCXO having reduced PWM effects includes an inverter (U1) having a DC feedback path (Rf) for biasing the inverter to a linear operating range and having an AC feedback path (40) for causing oscillations to occur and for varying the frequency of said oscillations in accordance with a frequency control bias voltage, Vbias. The AC feedback path includes a tank circuit (28) comprising a crystal (X1) having a first plate (22) coupled to an output (2) of the inverter via a source resistance (Rx), coupled to a source of reference potential via a varactor diode (D1) and coupled to a source (R1,T2) of the bias voltage (Vbias). The crystal (X1) has a second plate (24) coupled to an input of the inverter and coupled to the source of reference potential via a capacitor (C2) of fixed value. The source resistance is of a relatively high value selected to substantially attenuate the bias voltage whereby both the input and the output terminals of the inverter are effectively isolated from the bias voltage source. Advantageously, the PWM effect is reduced, the tuning range is extended and crystal power dissipation is reduced.

3 Claims, 3 Drawing Sheets

VCXO WITH REDUCED PWM EFFECTS HIGH SLEW RATE CONDITIONS

FIELD OF THE INVENTION

This invention relates to oscillators and particularly to voltage controlled crystal oscillators (hereafter "VCXO's").

BACKGROUND OF THE INVENTION

The uses of VCXO's are well known. They are particularly useful, for example, in phase lock loop (PLL) applications for supplying a variable frequency output signal to the loop phase detector under the control of the loop filter for locking the output of the VCXO to the frequency (or a multiple thereof) of an input signal applied to the phase detector. Other uses are also quite well known.

FIG. 1 is an example of a conventional (prior art) VCXO of the Pierce type and comprises an inverting logic gate U1 provided with a DC feedback path (feedback resistor Rf) for biasing the inverter U1 to a linear operating region and an AC feedback path for causing oscillations to occur and for controlling the frequency of the oscillations in response to a frequency control signal, Vbias, applied to a control input terminal T2.

The AC feedback path 20 includes a source resistor Rx that is AC coupled via a capacitor C1 to a first plate of a crystal X1 and is coupled to ground via a first varactor tuning diode D1. The second plate 24 of crystal X1 is coupled by a second varactor diode D2 to ground and to the input 1 of the inverter U1 via a DC blocking capacitor Cb. A bias voltage, Vbias, provided at an input terminal T2 via a suitable source (not shown), is coupled via resistors R1 and R2 to varactor diodes D1 and D2, respectively, for tuning the VCXO. The output 2 of inverter U1 is coupled to an output terminal T1 for supplying a clock output signal CL to external utilization circuitry (not shown). For purposes of illustration and explanation, exemplary element values are shown in the prior art example of FIG. 1.

In operation, the feedback resistor Rf provides DC bias for biasing inverter U1 to a linear operating region as previously noted. In the AC feedback path 20, the crystal X1 and the two varactor diodes D1 and D2 form a so-called "tank" circuit that determines and controls the oscillator frequency. As the control voltage (Vbias) at input terminal T2 increases, the capacitance of the varactor diodes D1 and D2 decreases thereby increasing the frequency of the VCXO output clock signal CL at teminal T1. Conversely, a decrease in Vbias will decrease the frequency of the output clock signal, CL.

SUMMARY OF THE INVENTION

It is herein recognized that certain problems may arise when a conventional varactor tuned VCXO's (as in the example of FIG. 1) are used in an applications (e.g., in a PLL or other application) wherein the VCXO control voltage (Vbias) exhibits a relatively high rate of change or "slew" rate. Such a condition may be frequently encountered in PLL applications during loop acquisition. In television apparatus, this may frequently occur when the VCXO is used for clock recovery in a digital demodulator and the user is "channel surfing" (i.e., scanning channels). During such relatively high slew rate conditions, the VCXO may exhibit a distorted output signal wherein the output signal exhibits pulse asymmetry. In the worst case, for very high slew rates of the control voltage, the pulse asymmetry may be so severe as to result in missing pulses.

The VCXO symmetry problem, as recognized herein, comprises an aspect of the present invention and will be hereinafter referred to as the "PWM" (pulse width modulation) effect. This effect is illustrated in the diagram of FIG. 2 for the conventional VCXO shown in FIG. 1. FIG. 2 illustrates bias voltage (Vbias) conditions for three time intervals (T1–T2, T2–T3 and T3–T4) and the VCXO clock output signal (CL) symmetry for the three time intervals. Symmetry is illustrated by the three inset clock (CL) signal waveforms 202 for the period from T1 to T2, 204 for the period from T2 to T3 and 206 for the period from T3 to T4.

As shown, when the VCXO control voltage (Vbias) is of a constant (or slowly changing) value (intervals T1–T2 and T3–T4), the clock output signal CL exhibits symmetry. Conversely, for rapidly changing values of Vbias (interval T2–T3) the clock output signal CL exhibits a distortion wherein the pulses are asymmetrical and some pulses may even be missing (as signified by the dotted line).

The present invention resides, in a first part, in the recognition of the PWM problem and in a second part, in providing a solution to the PWM problem that is both effective and economical.

Advantageously, the solution of the PWM effect, in accordance with the present invention, additionally provides the benefits of an extended tuning range and a reduced crystal power dissipation.

In accordance with the principles of the invention, circuit means are provided in the AC feedback path of a VCXO for effectively isolating the frequency control voltage (Vbias) from the input and the output terminals of the VCXO inverter.

In a preferred application of the principles of the invention the AC feedback path comprises a tank circuit including a crystal having a first plate coupled to an output of the inverter via a source resistance, coupled to a source of reference potential via a tuning means and coupled to a source of the bias voltage. The second plate of the crystal is coupled to an input of the inverter and coupled to the source of reference potential via a capacitor of fixed value. Also, the source resistance is of a relatively high value selected to substantially attenuate the bias voltage.

BRIEF DESCRIPTION OF THE DRAWING

The foregoing and further features of the invention are illustrated in the accompanying drawing, wherein like elements are denoted by like reference designators, and in which.

DETAILED DESCRIPTION

Figure 1:
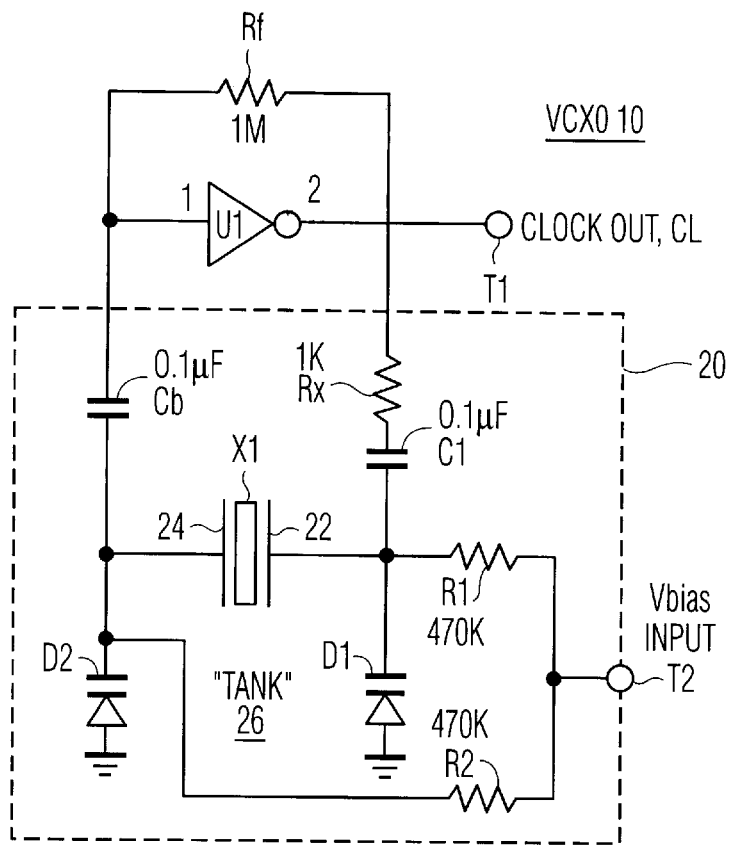
FIG. 1 is a detailed circuit diagram, with exemplary element values, of a conventional VCXO which may exhibit undesirable PWM effects for input signals having a high slew rate.
Figure 2:
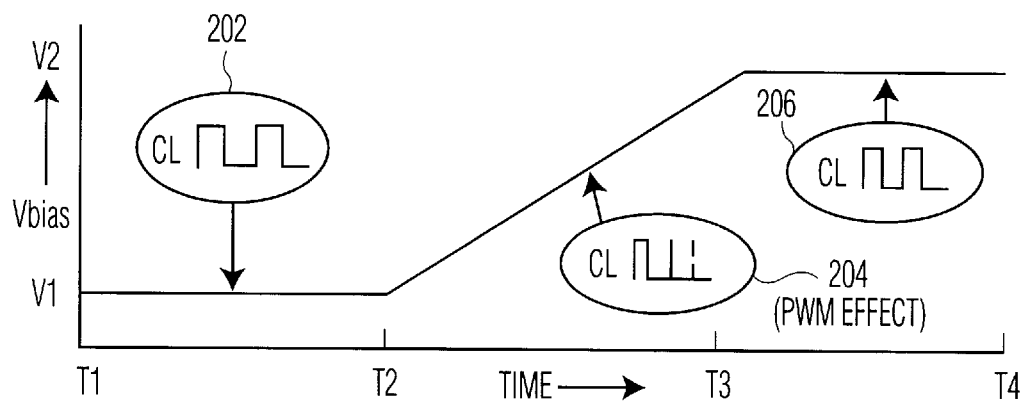
FIG. 2 is a diagram illustrating the PWM effect of the VCXO of the prior art VCXO of FIG. 1.
Figure 3:
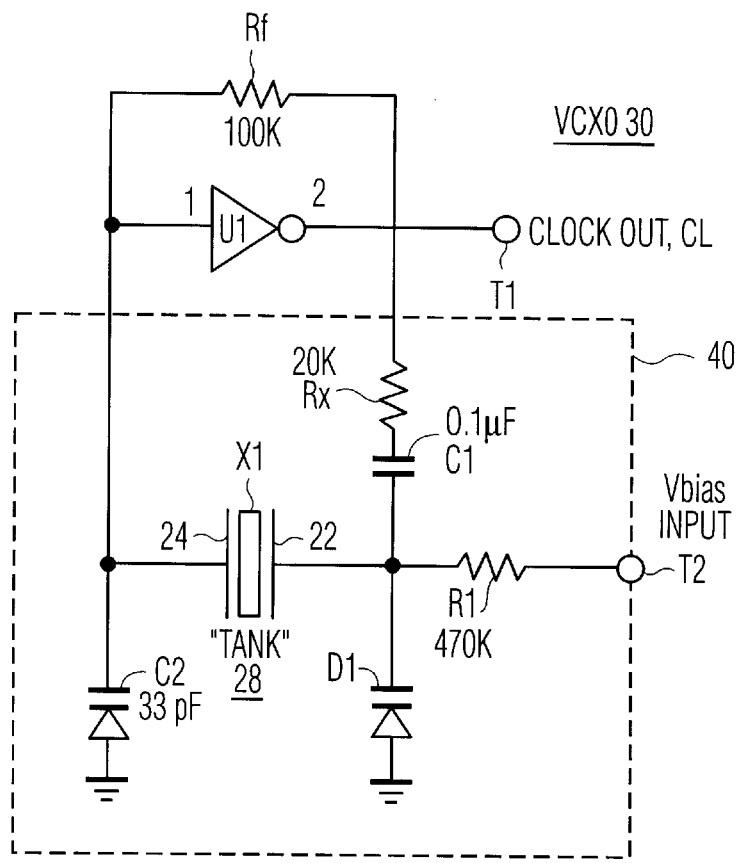
FIG. 3 is a detailed circuit diagram, with exemplary element values, of a VCXO embodying the invention having a reduced PWM effect, having an extended tuning range and having a decreased power dissipation.

The VCXO 30 of FIG. 3, embodying the invention, differs in a principal respect from the known oscillator discussed above in that it includes circuit means (Rx,C2) in the AC feedback path for effectively isolating the frequency control bias voltage, Vbias, from the input terminal (1) and the output terminal (2) of the inverter U1. More specifically, varactor diode D2 of the prior art example has been replaced by a fixed value capacitor C2 and resistor R2 has been eliminated. These changes isolate the bias voltage input terminal T2 from the input terminal 1 of inverter U1. The value of the fixed capacitor C2 is chosent to center the VCXO tuning range. Varactor diode D1 then becomes the only actively tuned element and bias voltage changes transients are isolated for input terminal 1 of inverter U1 by the crystal Y1. A second change is that the value of the tank circuit source resistance, Rx, has been substantially increased (from 1 K Ohms to 20 K Ohms) which both helps to isolate the bias voltage Vbias from the output terminal 2 of inverter U1 and additionally reduces the power dissipation of the crystal X1(thus increasing long term reliability) and enhances the overall tuning range. A preferred logic inverter is the type 74AC04 integrated circuit which exhibits a very high gain or transconductance.

Figure 4:
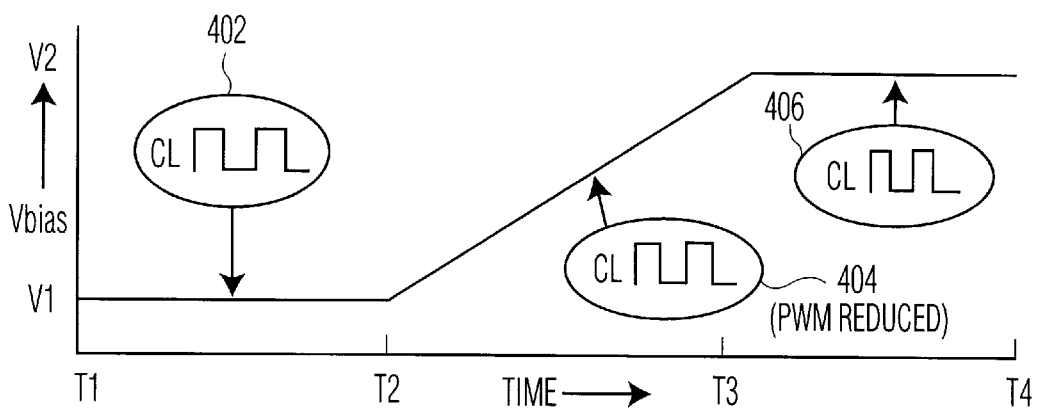
FIG. 4 is a diagram illustration reduction of PWM effects.
Figure 5:
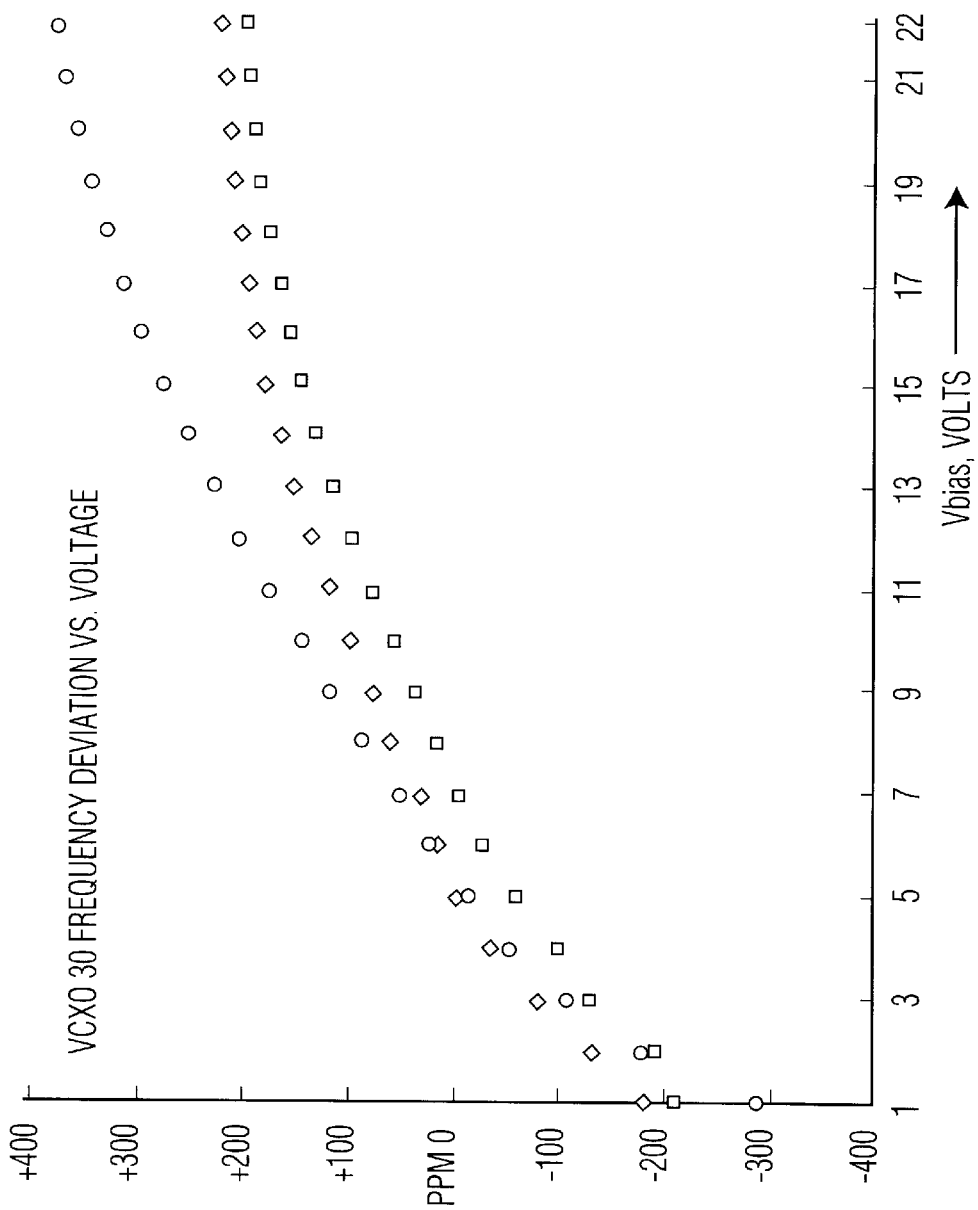
FIG. 5 is a diagram illustrating extension of the tuning range of the VCXO, embodying the invention, of FIG. 3.

FIGS. 4 and 5 provide further illustration of the operation of the VCXO and the advantageous features of reduced PWM effects and extended frequency range. FIG. 4 illustrates bias voltage (Vbias) conditions for three time intervals (T1–T2, T2–T3 and T3–T4) and the VCXO 30 clock output signal (CL) symmetry for the three time intervals. Symmetry is illustrated by the three inset clock (CL) signal waveforms 402 for the period from T1 to T2, 404 for the period from T2 to T3 and 406 for the period from T3 to T4. As shown, when the VCXO control voltage (Vbias) is of a constant (or slowly changing) value (intervals T1–T2 and T3–T4), the clock output signal CL exhibits symmetry. For rapidly changing values of Vbias (interval T2–T3) the clock output signal CL exhibits essentially no distortion, that is, the pulses are fully symmetrical and no pulses may even be missing. Thus, the PWM effect is greatly reduced as compared with the conventional VCXO previously discussed.

FIG. 5 provides a further illustration of the operation of the VCXO 30 of FIG. 3 as compared with the conventional oscillator previously described. More specifically, FIG. 5 is a plot of the VCXO frequency deviation vs Voltage characteristics for both the known VCXO 10 and VCXO 30 of the present invention. Deviation is expressed in parts per million (PPM) on a scale from −400 to +400 for a Vbias voltage range from 1 Volt to 22 Volts. The prior art oscillator is signified by the diamond shaped symbols and, as shown, provides a deviation that ranges from −190 PPM to +220 PPM for an input Vbias change from one to twenty two volts. The box symbol represents the operation of the VCXO 30 of the present invention with the replacement of varactor D2 by capacitor C2 but without the change in value of the source resistance Rx. As seen, the overall deviation is about the same as in the prior art VCXO 10 but shifted down by a few PPM. The circle symbols represent the overall effect of replacement of D2 by C2 and increasing the value of Rx. As seen, the deviation is dramatically increased to a range from about −280 PPM to about +390 PPM for a change in Vbias from one to twenty-two volts.

What is claimed is:

1. A VCXO having reduced PWM effects, comprising:

an inverter (U1) having an input terminal (1), an output terminal (2) and a DC feedback path (Rf) for biasing the inverter to a linear operating range and having an AC feedback path (40) for causing oscillations to occur and for varying the frequency of said oscillations in accordance with a frequency control bias voltage, Vbias, applied to a control terminal (T2) of said AC feedback Path;

circuit means (Rx,C2) in said AC feedback path for effectively isolating said frequency control bias voltage, Vbias, applied to said control terminal (T2) of said AC feedback path from said input terminal ({T}1) and said output terminal ({T}2) of said inverter for reducing said PWM effects;

said circuit means including a fixed value capacitor wherein one end of said capacitor is directly connected to the input of said inverter and second end of said capacitor is directly connected to ground said junction being DC isolated from said control terminal (T2) of said AC feedback path, said junction being coupled to no other capacitors; and a resistor coupled between said output terminal of said inverter and a further plate of said crystal to which said bias voltage is applied, said resistor having a relatively high value, subsequently greater than 1 K ohm, selected to substantially said isolate said bias voltage applied to said control terminal of said AC isolate feedback path from said output terminal of said inverter.

2. A VCXO as recited in claim 1 wherein for tuning said VCXO said AC feedback path includes solely said fixed capacitor connected between said plate of said crystal and said source of reference potential, and a tunable capacitance coupled between said further plate of said crystal and said source of reference potential.

3. A VCXO as recited in claim 2 wherein said value of said resistor resistor is selected to be on the order of about twenty thousand Ohms.

* * * * *